United States Patent [19]

Parent

[11] 4,373,952
[45] Feb. 15, 1983

[54] INTERMETALLIC COMPOSITE

[75] Inventor: Edward D. Parent, Hamilton, Mass.

[73] Assignee: GTE Products Corporation, Stamford, Conn.

[21] Appl. No.: 313,002

[22] Filed: Oct. 19, 1981

[51] Int. Cl.³ .............................. B22F 3/14; C22C 1/05
[52] U.S. Cl. .............................. 75/244; 75/248; 252/520
[58] Field of Search ............... 75/244, 248, 202, 254; 252/520; 200/265, 266; 501/98, 96

[56] References Cited

U.S. PATENT DOCUMENTS

| | | | |
|---|---|---|---|
| 3,003,885 | 10/1961 | Mandorf | 252/520 |
| 3,181,968 | 5/1965 | Mandorf | 252/520 |
| 3,202,862 | 8/1965 | Paley | 75/202 |
| 3,236,663 | 2/1966 | Grulke | 252/520 |
| 3,251,700 | 5/1966 | Mandorf | 252/520 |
| 3,256,103 | 6/1966 | Roche | 252/520 |
| 3,408,312 | 10/1968 | Richards | 252/520 |
| 3,433,656 | 3/1969 | Allen | 252/520 |
| 3,544,486 | 12/1970 | Passmore | 252/520 |
| 3,582,611 | 6/1971 | Matheson | 252/520 |
| 3,813,252 | 5/1974 | Lipp | 252/520 |
| 3,915,900 | 10/1975 | Reinmuth | 252/520 |
| 3,928,244 | 12/1975 | Passmore | 252/520 |
| 4,008,183 | 2/1977 | Ishii | 75/244 |
| 4,029,000 | 6/1977 | Nakamura | 501/96 |

*Primary Examiner*—G. Ozaki
*Assistant Examiner*—J. J. Zimmerman
*Attorney, Agent, or Firm*—William H. McNeill

[57] ABSTRACT

A hot pressed intermetallic composite comprises titanium diboride and boron nitride and an effective amount of tungsten to reduce erosion of the composite and reduce the rate at which the electrical resistivity of the composite changes during its use.

6 Claims, No Drawings

INTERMETALLIC COMPOSITE

TECHNICAL FIELD

This invention relates to intermetallic composites and more particularly to self resistance heated bar sources employed for the evaporation of materials such, for example, as aluminum.

BACKGROUND ART

The use of vacuum hot pressed intermetallic composites as self resistance heated evaporation sources is well established. These composites are employed in the evaporation of aluminum and wide range of other metals and alloys. One class of these composites comprises binary intermetallics composed of titanium diboride ($TiB_2$) and boron nitride (BN). Another class of these composites comprises ternary intermetallics including the above-named materials with the addition of aluminum nitride (AlN). These composites are available in a wide range of resistivities of from about 50 to 2000 $\mu\Omega$-cm (microhm centimeter). As evaporation sources, e.g. for aluminum, these composites are generally considered to have served their useful life when their resistivity has fallen to a value of about 50% of their initial value. At this point, the amperage required to maintain a constant evaporation rate is deemed to be excessive from an economic standpoint.

It has been postulated that the failure is caused by vaporization of some of the composite materials during use. The vaporization leaves voids in the composite, which voids are replaced by the molten evaporant, e.g., aluminum, thus lowering the resistivity of the composite.

When aluminum is the evaporant, another failure mechanism that can occur is the formation of an anti-wetting surface due to the reaction of the molten aluminum with oxide impurities in the composite. It is known that commercial grades of titanium diboride and boron nitride contain small but significant amounts of boron oxide as $B_2O_3$. The reaction has been suggested to occur as follows:

$$10\ Al + 3\ B_2O_3 + 3\ TiB_2 \rightarrow 6\ AlB_2 + 3\ TiO + 2\ Al_2O_3. \quad (1)$$

The $AlB_2$ represents crystal accumulation while the TiO and $Al_2O_3$ provide an anti-wetting surface.

When aluminum is the evaporant a reaction between it and boron nitride in the composite is less likely because of the low contact affinity between them; but, again, in the presence of oxides, such as for example $B_2O_3$, a reaction can occur which will produce compounds which restrict the evaporation surface, this reaction proceeding as follows:

$$3\ Al + B_2O_3 \rightarrow Al_2O_3 + AlB_2. \quad (2)$$

DISCLOSURE OF THE INVENTION

It is, therefore, an object of the invention to obviate the disadvantages of the prior art.

It is another object of the invention to enhance the life expectancy and performance of intermetallic composites.

It is a further object of the invention to provide an intermetallic composite having a retarded resistivity drop during use as a self-resistance heated evaporation source.

These objects are accomplished, in one aspect of the invention, by the provision of a hot pressed intermetallic composite comprised of at least titanium diboride and boron nitride and including tungsten in an effective amount to reduce erosion of the composite and reduce the rate at which the electrical resistivity of the composite drops during its use.

While the exact reason for the significant improvement observed in the intermetallic composites containing tungsten are not known with certainty, it is believed that, at least, the tungsten addition reduces $B_2O_3$ and other oxide impurities to tungsten borides, which are easily wettable, and a volatile species in accordance with the following typical reaction:

$$7\ W + 2\ B_2O_3 \rightarrow 4\ WB + 3\ WO_2 \uparrow \quad (3)$$

The enhanced wetting capability of the composite evaporation surface by means of this invention prevents localized erosion and consequent unstable electrical properties during its operations as a continuous metallizing source.

BEST MODE FOR CARRYING OUT THE INVENTION

For a better understanding of the present invention, together with other and further objects, advantages and capabilities thereof, reference is made to the following disclosure and appended claims.

In accordance with an exemplary embodiment of the invention, a desirable ternary mixture for the formation of an intermetallic composite includes from 0.1% to 20% by weight of metallic tungsten powder. The mixture is blended until substantially homogeneous, pre-pressed, placed in a graphite mold, and then hot pressed at about 1950° C. at a pressure of 3000 psi, to achieve a density greater than 85% of theoretical. The finished, pressed composite can then be machined to final shape, including a cavity, if desired.

In a specific, preferred embodiment of the invention, an intermetallic composite was prepared which comprised the following ingredients, in weight percent: about 50.2% titanium diboride; about 30.0% boron nitride; about 11.9% aluminum nitride; and about 7.9% tungsten.

These ingredients were blended in a ball mill to provide a substantially homogeneous mixture. The mixture was then placed in a graphite mold and hot pressed at 1950° C. at a pressure of 3000 psi. The finished composite had a density 91.6% of theoretical, and a resistivity of 750 microohm-centimeters. When tested under similar conditions against a control employing the same proportion of ingredients but without the tungsten, the tungsten containing composite was found to produce better films (when using aluminum as the evaporant) and was found to have a life expectancy 80% longer than the control. Further, at the end of the test runs, it was observed that the tungsten containing composite exhibited a nearly complete absence of colored oxides (such as $Al_2O_3$ and $TiO_x$) and a minimal accumulation of crystalline deposits, such as $AlB_x$, on the cooler parts of the composite.

While, as mentioned above, the exact reason for the noted improvement in the tungsten containing composite is not known with certainty, x-ray diffraction analysis of the composite confirms the presence of tungsten boride (WB) therein, which would appear to support the hypothesis of equation (3).

While there have been described what are at present considered to be the preferred embodiments of the invention, it will be apparent to those skilled in the art that various changes and modifications can be made herein without departing from the scope of the invention as defined by the appended claims.

INDUSTRIAL APPLICABILITY

The composite described herein is suitable for employment as an evaporation source in the deposition of electronic microcircuits and thin films on both metal and glass substrates. It is particularly suited for the aluminization of glass, metal and plastic films in long, continuous runs at high speed. Its low reactivity with aluminum insures long life and fewer transient changes in the composite.

It is also readily employed for metallizing reflective surfaces and decorative stampings for automotive, appliance, and other consumer and commercial equipment.

I claim:

1. A hot pressed intermetallic composite comprised of titanium diboride and boron nitride and including tungsten in an amount of from about 0.1% to 20% by weight and having a density of at least 85% of theoretical.

2. The intermetallic composite of claim 1 which includes also aluminum nitride.

3. The intermetallic composite of claim 2 wherein said composite comprises about 50.2 weight percent titanium diboride; about 30 weight percent boron nitride; about 11.9 weight percent aluminum nitride; and about 7.9 weight percent tungsten.

4. The intermetallic composite of claim 3 wherein said composite has a density of about 91.6% of theoretical.

5. A hot pressed intermetallic composite for use in the evaporation of aluminum comprising titanium diboride and boron nitride and an effective amount of tungsten to reduce erosion of said composite and reduce the rate at which the electrical resistivity of said composite changes during its use.

6. The intermetallic composite of claim 5 wherein said composite includes aluminum nitride.

* * * * *